United States Patent [19]

Yagi et al.

[11] 4,027,324
[45] May 31, 1977

[54] BIDIRECTIONAL TRANSISTOR

[75] Inventors: Hajime Yagi, Tokyo; Tadaharu Tsuyuki, Isehara, both of Japan

[73] Assignee: Sony Corporation, Tokyo, Japan

[22] Filed: Jan. 21, 1976

[21] Appl. No.: 651,161

Related U.S. Application Data

[63] Continuation-in-part of Ser. No. 561,914, March 25, 1975, which is a continuation-in-part of Ser. No. 427,648, Dec. 26, 1973, abandoned.

[30] Foreign Application Priority Data

Dec. 29, 1972 Japan .................................. 47-550
Mar. 28, 1974 Japan ............................. 49-35307
Oct. 31, 1974 Japan ........................... 49-125869

[52] U.S. Cl. .................................. 357/34; 357/37; 357/39; 357/40; 357/89
[51] Int. Cl.² ............... H01L 29/72; H01L 29/747; H01L 27/02
[58] Field of Search ................ 357/34, 37, 39, 40, 357/89

[56] References Cited

FOREIGN PATENTS OR APPLICATIONS 2,130,399 3/1972 France ................................. 357/34
906,036 9/1962 United Kingdom ................. 357/34

*Primary Examiner*—Edward J. Wojciechowicz
*Attorney, Agent, or Firm*—Hill, Gross, Simpson, Van Santen, Steadman, Chiara & Simpson

[57] ABSTRACT

This invention relates to a bidirectional transistor, and particularly to a transistor having two low impurity concentration regions on either side of a base region which act as the emitter or collector regions with a minority carrier diffusion length L substantially greater than the width of such emitter and collector regions when operating in either direction. High impurity concentration regions interface with the low impurity concentration regions to provide a built-in-field which is larger than $kT/(qL)$ and which make the drift current produced by the built-in-field substantially balance the minority carrier diffusion current injected from the base region. The built-in-field is preferably larger than $10^3$ V/cm, and the potential barrier across is preferably larger than 0.1 eV. Two of the high impurity concentration regions provide first and second L-H junctions. A third L-H junction surrounds one of the low impurity concentration regions. This third L-H junction greatly improves the bidirectional characteristics of the device.

7 Claims, 5 Drawing Figures

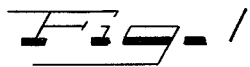
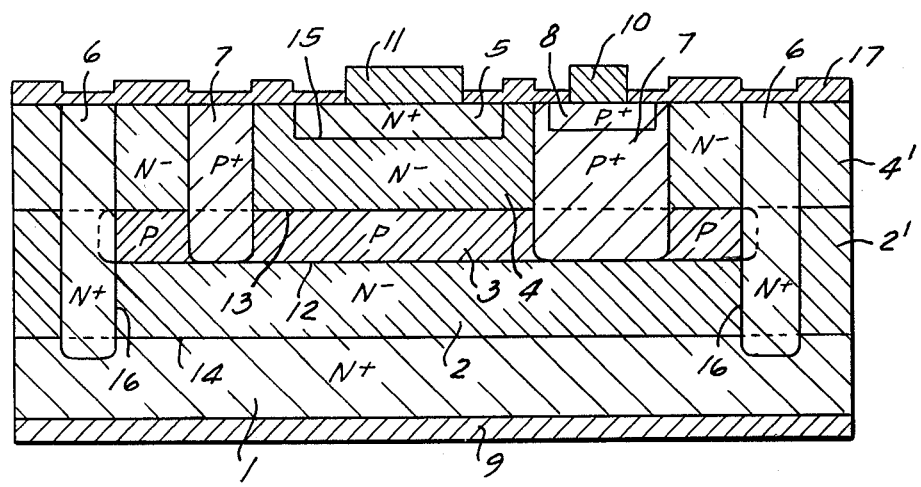
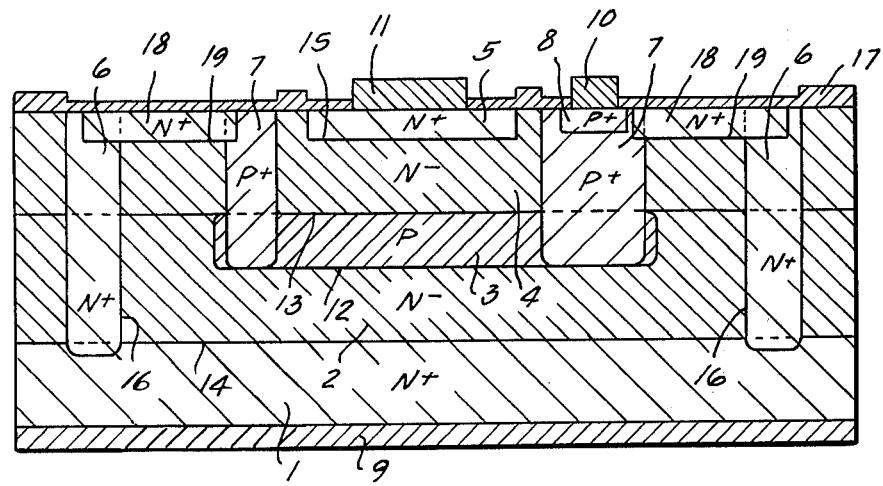

BIDIRECTIONAL TRANSISTOR

CROSS REFERENCE TO RELATED APPLICATIONS

This application is a continuation-in-part of applicants' copending application, Ser. No. 561,914, filed Mar. 25, 1975, which in turn is a continuation-in-part of applicants' application Ser. No. 427,648, filed Dec. 26, 1973, now abandoned and assigned to the same assignee.

FIELD OF THE INVENTION

It has been common practice in fabricating conventional bipolar transistors to employ a double diffusion technique to form the emitter-base junction, in which the doping concentration of the emitter is made higher than the base. As this difference becomes larger, the emitter efficiency becomes greater and is more nearly unity. However, the emitter efficiency in the reverse operation is smaller than in the normal operation, because the structure is not symmetrical with respect to the central base region. As a result, the bidirectional characteristic in gain, for example, the emitter grounded current gain ($h_{FE}$), is not obtained by such a double diffused structure.

It should be noted that the $N^+N^-P\ N^-N^+$ or $P^+P\ N\ P\ P^-$ structure will result in a better bidirectional characteristic, but this is not sufficient.

BRIEF SUMMARY OF THE INVENTION

It is an object of the present invention to provide a semiconductor device having greatly improved bidirectional characteristics, including a very substantial increase in the current gain factor.

More specifically, this invention relates to a bidirectional transistor, and particularly to a transistor having two low impurity concentration regions on either side of a base region which act as the emitter or collector regions with a minority carrier diffusion length L substantially greater than the width of such emitter and collector regions when operating in either direction. High impurity concentration regions interface with the low impurity concentration regions to provide a built-in-field which is larger than $kT/(qL)$ and which make the drift current produced by the built-in-field substantially balance the minority carrier diffusion current injected from the base region. The built-in-field is preferably larger than $10^3$ V/cm, and the potential barrier across is preferably larger than 0.1 eV. Two of the high impurity concentration regions provide first and second L-H junctions. A third L-H junction surrounds one of the low impurity concentration regions. This third L-H junction greatly improves the bidirectional characteristics of the device.

BRIEF DESCRIPTION OF THE DRAWINGS

FIG. 1 is a diagrammatic fragmentary sectional view of an NPN transistor embodying the novel features and characteristics of the present invention;

FIG. 2 is a diagrammatic fragmentary view of an NPN transistor which is a second embodiment of the present invention;

DESCRIPTION OF THE PREFERRED EMBODIMENTS

Figure 3:
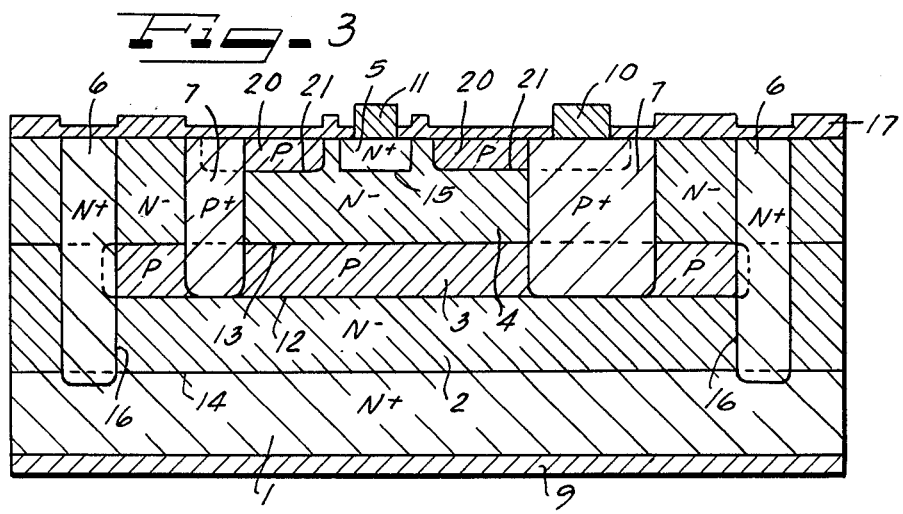
FIG. 3 is a diagrammatic fragmentary view of an NPN transistor which is a third embodiment of the present invention.

A preferred embodiment of the present invention, as embodied in an NPN transistor, is shown in FIG. 1. As shown, a substrate 1 heavily doped with $N^+$ type impurities or specifically, a substrate 1 may be formed of silicon heavily doped with antimony. The doping is preferably $4 \times 10^{18}$ atoms/cm$^3$. This gives a resistivity of approximately 0.01 ohm-cm. It has been found that this doping may vary to cause a resistivity of between 0.008 and 0.012 ohm-cm. The thickness of the substrate is preferably approximately 250 microns.

An $N^-$ type silicon epitaxial layer 2' is formed on the substrate 1 to be used as a collector or as an emitter, together with the $N^+$ substrate 1. This epitaxial layer 2' is lightly doped with antimony sufficient to provide a doping concentration of $2.5 \times 10^{15}$ atoms/cm$^3$. The resistivity is approximately 1 to 3 ohm-cm. The epitaxial layer is preferably approximately 5.5 microns thick.

A P type diffused layer 3' is then selectively formed on the $N^-$ type layer 2' to provide the active base 3 for the transistor. The doping may be boron in sufficient quantity to give a doping concentration of $1 \times 10^{16}$ atoms/cm$^3$. The thickness of the layer 3' is approximately 5.0 microns. Boron ions can be implanted selectively with energy of 50 KeV, doping of $1 \times 10^{13}$ atoms/cm$^2$ and to a depth of 1.5 microns because of control of $h_{FE}$ is more exact.

An $N^-$ type second silicon epitaxial layer 4' is then formed on said $N^+$ type layer 2' to provide an emitter or a collector. The layer 4' is lightly doped with antimony, the doping concentration being approximately $1.5 \times 10^{15}$ atoms/cm$^3$. The resistivity is approximately 3 ohm-cm. The thickness of the layer 4' is approximately 4.5 microns.

An $N^+$ type diffused layer 5 is then provided which is heavily doped with phosphorus. This diffused layer has a surface doping concentration of approximately $10^{20}$ atoms/cm$^3$ and a thickness of approximately 1.0 micron. As a result, the thickness of the $N^-$ emitter region 4 is 3.5 microns.

Whenever the term "emitter or collector" is used herein, it refers to the region 4 acting as the emitter when the operation is in one direction and as the collector when the device is operated in a reverse direction. Whenever the term "collector or emitter" is used, it refers to the region 2 acting as the collector in said one direction and acting as the emitter when acting in the reverse direction.

An $N^+$ type diffused region 6 heavily doped with phosphor surrounds the NPN transistor described above. The doping is approximately $3 \times 10^{19}$ atoms/cm$^3$ as a surface concentration. This doping penetrates through the $N^-$ type layer 4' into the $N^-$ type layer 2' until it reaches the $N^+$ region 1 of the substrate. Regions 6 and 1 form a cup-shaped region which surround region 2. The region 6 contributes the symmetric $h_{FE}$ characteristic in bidirectional transistor operation.

A $P^+$ type conductive path 7 is employed as a conductive path to the base region 3. The conductive path 7 is a region which doped with boron with a doping concentration of approximately $3 \times 10^{19}$ atoms/cm$^3$ at the surface. The conductive path 7 penetrates through the $N^-$ type layer 4' into the P base layer 3 which limits and surrounds the emitter or collector region 4. The ring shape region is shown widened in FIG. 1 below where a base electrode is to be added to provide a better contact area. Regions 7 and 3 combine to form a P type cup-shape region which surrounds region 4.

A P⁺ type diffused region 8 may be provided if desired to provide a better ohmic contact with the conductive path 7, and this region 8 is heavily doped with boron.

A collector or emitter electrode 9 of aluminum is formed on the under surface of the substrate 1. A base electrode 10 of aluminum is formed on the base contact area 8. An emitter or collector electrode 11 of aluminum is formed on the heavily doped emitter or collector region 5.

A silicon dioxide layer 17 for passivation covers the upper surface of the device.

As a result of the above, the N⁻ layer 2 and the P layer 3 form a collector or emitter base junction 12 at their interface. The P layer 3 and the N⁻ layer 4 form an emitter or collector base junction 13 at their interface. The N⁻ layer 2 and the N⁺ layer 1 form the first L-H junction 14 at their interface of the same impurity type (it being noted that the expression L-H identifies two abutting regions of the same impurity type, one being lightly doped and the other being heavily doped). The width $W_1$ between the collector or emitter base junction 12 and the first L-H junction 14 is less than the minority carrier diffusion length $L_p$ and is approximately 4 microns. The width $W_1$ is smaller than the original thickness of the epitaxial layer, since post-diffusion occurs from the N⁺ region 1 during other diffusion processes. The N⁻ region 4 and the N⁺ region 5 form the second L-H junction 15 of the same impurity type. The greatest width $W_2$ between the emitter or collector base junction 13 (taken perpendicularly to junction 13) and the second L-H junction 15 is less than the minority carrier diffusion length $L_p$ and is approximately 3.5 microns.

The N⁻ region 2 and the N⁺ region 6 form a third L-H junction 16 of the same impurity type. The distance $W_3$ between the collector or emitter base junction 12 taken perpendicularly to the junction 12 and the third L-H junction 16 is less than the minority carrier diffusion length $L_p$ and is approximately 20 microns.

The second L-H junction 15 having a high built-in-field causes a high $h_{FE}$ characteristic in one direction of operation where the electrode 11 is used as the emitter electrode and the electrode 9 is used as the collector electrode. In the reverse operation, the first L-H junction 14 and the third L-H junction 16 having a high built-in-field, cause the high reverse $h_{FE}$ characteristic, where the electrode 9 is used as the emitter electrode and the electrode 11 is used as the collector electrode.

The other feature of this first embodiment is that the N⁻ collector or emitter region 2 is wholly surrounded by the N⁺ region 1, the N⁺ region 6 and the P base region 3. In other words, the N⁻ layer 2 is surrounded by the first L-H junction 14, the third L-H junction 16 and the collector-base P-N junction 12. Such a structure causes a high $h_{FE}$ characteristic in reverse operation of the transistor, because of lack of an N⁻ region 2 at the surface of the device.

The structure above described provides a high $h_{FE}$ characteristic. In explanation of why this result is obtained, it will be noted that the emitter-grounded current gain $(h_{FE})$ is one of the important parameters of the transistor. This is generally given as $$h_{FE} = \frac{\alpha}{1-\alpha} \qquad (1)$$

where $\alpha$ is a base-grounded current gain. The current gain $\alpha$ is given as $$\alpha = \alpha^* \cdot \beta \cdot \gamma \qquad (2)$$

where $\alpha^*$ is a collector multiplication ratio, $\beta$ is a base-transport factor, and $\gamma$ is emitter efficiency.

In an NPN transistor, for example, the emitter efficiency is given as $$\gamma = \frac{Jn}{Jn + Jp} = \frac{1}{1 + Jp/Jn} \qquad (3)$$

where $Jn$ is the electron current density resulting from the electrons which are injected through the emitter base junction from the emitter to the base, and $Jp$ is a hole current density of the holes which are injected through the same junction from the base to emitter reversely.

The electron current density $Jn$ is given as $$Jn = \frac{q \cdot Dn \cdot np}{Ln} \cdot (e^{\frac{qv}{kT}} - 1) \qquad (4)$$

$$Jp = \frac{q \cdot Dp \cdot Pn}{Lp} \cdot (e^{\frac{qv}{kT}} - 1) \qquad (5)$$

where $Ln$ is the electron diffusion length in the P type base, $Lp$ is the hole diffusion length in the N type emitter which is determined by $\sqrt{D_p t_p}$. $t_p$ is the hole lifetime. $Dn$ is the electron diffusion constant. $Dp$ is the hole diffusion constant. $Np$ is the electron concentration in P type base in a state of equilibrium. $Pn$ is the hole concentration in N⁻ type emitter in a state of equilibrium. $v$ is the voltage applied to the emitter-base junction. $T$ is the temperature. $q$ is the charge of the electron. $k$ is the Boltzmann's constant.

As a value $\delta$ is the ratio of $Jp$ and $Jn$ it may then be shown as $$\delta = \frac{Jp}{Jn} = \frac{Ln}{Lp} \cdot \frac{Dp}{Dn} \cdot \frac{Pn}{np} \qquad (6)$$

and also given as $$\delta = \frac{W}{Lp} \cdot \frac{Dp}{Dn} \cdot \frac{N_A}{N_D} \qquad (7)$$

replacing the ratio $$\frac{Pn}{np} = \frac{N_A}{N_D}$$

where $N_A$ is the acceptor concentration of the base region, $N_D$ is the donor concentration of the emitter region, and $W$ is a base width to which the electron diffusion length is limited.

The carrier diffusion constants $Dn$ and $Dp$ are functions of the carrier mobility and the temperature and they can be substantially constant.

In the device of FIG. 1, the lightly doped emitter or collector 4 and the lighly doped collector or emitter 2 are located between the base region 3 and the second L-H junction 15, and between the base region 3 and the first and third L-H junctions 14 and 16, and therefore, the value $Lp$ becomes very large. For example, under the condition that the lightly doped emitter or collector 4 and the collector or emitter 2 have the impurity concentration in the order of $10^{15}$ atoms/cm$^3$ and the epitaxial layer is fabricated to have a good lattice condition, the value Lp becomes about 50 to 100 microns.

One important feature of the present invention is that the minority carrier diffusion length of the emitter and collector is larger than the widths $W_1$, $W_2$ and $W_3$ between the base region 3 and the L-H junctions in the lightly doped regions.

It is another important factor of the present invention that an L-H junction 14, 15 or 16 be located in the emitter. The L-H junction forms a "built-in-field" in the emitter and this field acts in such a direction that the hole current from the emitter-base junction is reduced.

The built-in-field of the L-H junction must be larger than $kT/(qLp)$ and is preferably larger than $10^3$ V/cm. When this is satisfied the equation (5) is charged to be as follows:

$$Jp' = K \frac{q \, Dp' \, Pn'}{Lp'} \left\{ \exp\left(\frac{qV}{kT}\right) - 1 \right\}$$

$$+ \frac{q \, Dp \, Pn}{Lp} \tanh\left(\frac{W_E}{L_p}\right) \left\{ \exp\left(\frac{qV}{kT}\right) - 1 \right\} \quad (8)$$

where $K$ is a constant which is less than unity, $Dp'$ is the hole diffusion constant, $Pn'$ is the hole concentration, and $Lp'$ is the hole diffusion length in the heavily doped emitter. The first term shows the current density injected into the heavily doped emitter. The second term shows the current density recombined in the lightly doped emitter, and hyperbolic tangent ($W_E/L_p$) is approximately $W_E/L_p$ under the condition $Lp >> W_E$. The value of the first term is smaller than that of the second term, and $Jp'$ is not substantially influenced by the recombination in the heavily doped emitter.

The difference in impurity concentration on opposite sides of each said semiconductor L-H junction is selected to provide an energy barrier higher than the energy level of injected minority carriers reaching said L-H junction from the nearest PN junction of the base and to provide the built-in field larger than $Kt/(qL)$.

The potential difference of the built-in-field is preferably larger than 0.1 eV.

The total width of the lightly doped region 4 and the heavily doped region 5 is smaller than the diffusion length in the lightly doped region 4 and the width of the heavily doped region 5 is smaller than the width of the lightly doped region 4.

The low noise characteristics may be explained as follows: The lattice defect or the dislocation is largely decreased because the emitter-base junction 13 is formed by the lightly doped emitter 4 and also lightly doped base 3. The impurity concentration of the lightly doped emitter 4 should be limited by consideration of the noise characteristics, the life time $\tau_p$ and the minority diffusion length Lp, to a value approximately less than $10^{18}$ atoms/cm$^3$.

Another factor causing a low noise level is that the emitter current flows almost in a vertical direction in the lightly doped emitter 4 and the lightly doped base 3.

A similar situation results when the region 2 is functioning as the emitter.

FIG. 2 shows the second embodiment of the present invention. The device shown in FIG. 2 is quite similar to that of the first embodiment shown in FIG. 1 except an additional N$^+$ layer 18 is formed at the surface of the N$^-$ collector or emitter layer 2 forming a fourth L-H junction 19 with the N$^-$ collector or emitter layer 2. The same numerals are used in FIG. 2 to show substantially the same regions as those of FIG. 1. It has a first region 1 of N$^+$ type, a second region 2 of N$^-$ type interfaced therewith which is used as a part of collector or emitter which forms a first L-H junction 14 with the first region 1. It also has a third (base) region 3 of P type, a fourth region 4 of N$^-$ type which is used as a part of emitter or collector, a fifth region 5 of N$^+$ type forming a second L-H junction 15 with the fourth region 4 and a sixth region 6 of N$^+$ type surrounding the second region 2 forming the third L-H junction 16.

In the second embodiment as well as the first one, the width or distance $W_1$ between the first L-H junction 14 and a first PN junction 12, the width or distance $W_2$ between the second L-H junction 15 and a second PN junction 13, the distance $W_3$ between the third L-H junction 16 and the first PN junction 12, and the distance $W_4$ between the fourth L-H junction 19 and the first PN junction 12 are selected less than the minority carrier diffusion length Lp, hole diffusion length, in the case of NPN transistor, in the lightly doped regions 2 and 4. The difference in impurity concentration on opposite sides of the fourth L-H junction 19 is selected as for that across the second L-H junction 15.

FIG. 3 shows the third embodiment of the present invention. This device also is very similar to the first embodiment shown in FIG. 1, except for the additional P region 20 which forms a third PN junction 21 with the lightly doped N$^-$ region 4. The P region 20 is located at the surface of the N$^-$ region surrounding the heavily doped N$^+$ region 5. The width or distance $W_5$ between the third PN junction 21 and the second PN junction 13 is selected less than the carrier diffusion length Lp in the lightly doped N$^-$ region 4. The additional P region 20 is connected to the base conductive path 7 and to the base electrode 10. It causes a high $h_{FE}$ characteristic when the electrode 10 is used as the emitter electrode, together with the second L-H junction 15 in the emitter 4.

Figure 4:
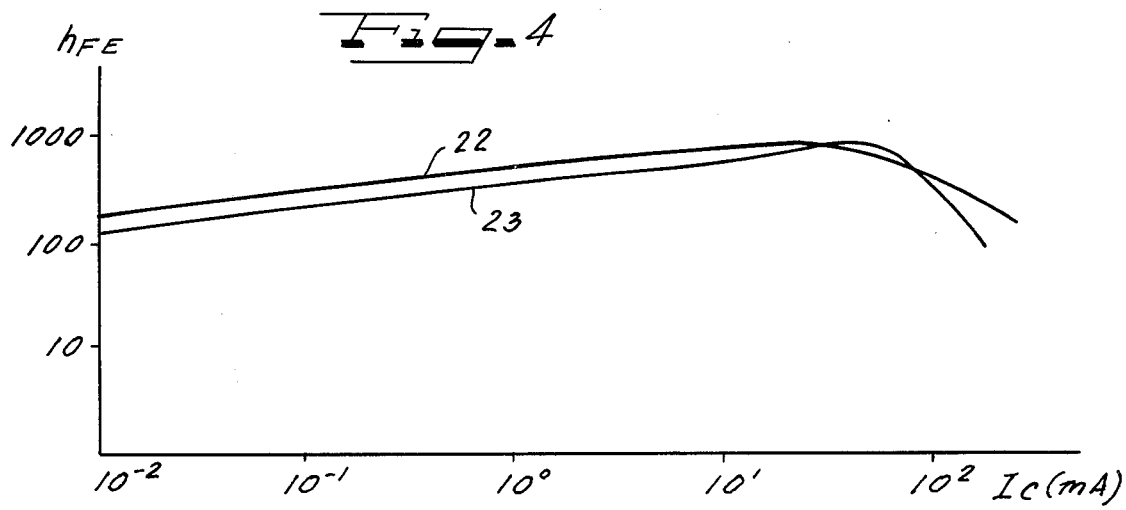
FIGS. 4 and 5 are plots of emitter-grounded current gain ($h_{FE}$) as a function of collector current ($I_c$).

FIG. 4 shows a plot of emitter-grounded current gain ($h_{FE}$) as a function of collector current ($I_c$). The line 22 shows the $h_{FE}$ of the present invention shown in FIG. 1, when the device is normally operated where the N$^-$ region 4, the N$^+$ region 5 are used as the emitter and where the N$^-$ region 2 and the N$^+$ region 1 are used as the collector. The other line 23 shows the $h_{FE}$ of the same device, when the device is reversely operated where the N$^-$ region 2 and the N$^+$ region 1 are used as the emitter and where the N$^-$ region 4 and the N$^+$ region 5 are used as the collector. The input signal is applied between the emitter and the base. The output signal is obtained between the emitter and collector. It is remarkable that both lines 22 and 23 have almost the same characteristics.

Figure 5:
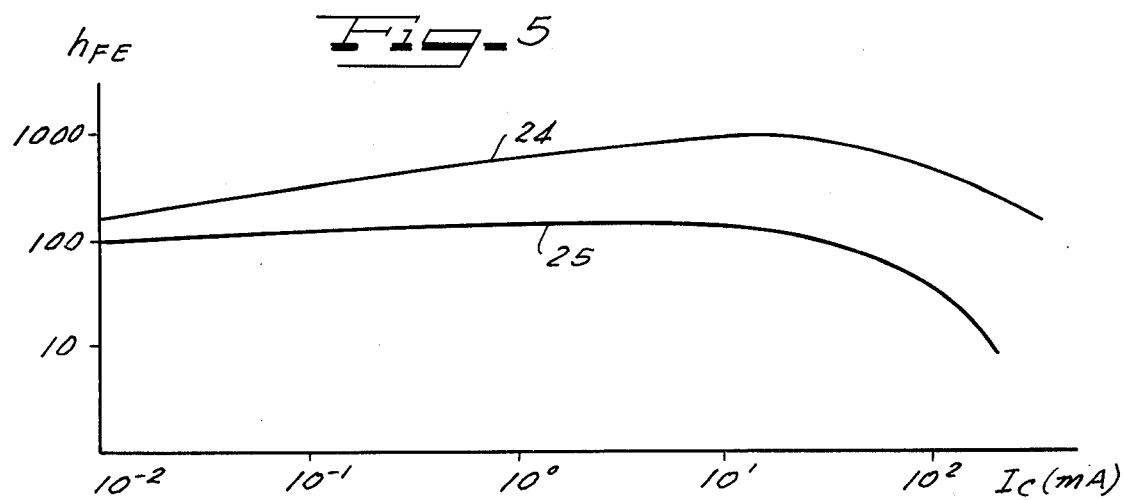

FIG. 5 also shows a plot of the $h_{FE}$ as a function of the $I_c$, and illustrates what happens if the third L-H junction is omitted. Both lines 24 and 25 show $h_{FE}$ of a device which does not have the third L-H junction 16 but does have the other arrangements shown in the device of FIG. 1. The line 24 shows $h_{FE}$ in normal operation and has relatively high $h_{FE}$ value as does the line 22 in FIG. 4. But the line 25 shows the other $h_{FE}$ in reverse operation and which has a relatively low $h_{FE}$ value. From the comparsion between FIG. 4 and FIG. 5, it is clear that the third L-H junction 16 causes a very good bidirectional characteristic in a transistor.

The pattern of the heavily doped region 5 is arbitrary. It can be a ring-shaped region or a plurality of regions.

The active base region can be formed by a relatively heavily doped region and a lightly doped region. The former may be formed in a mesh or stripe pattern and this contributes to reducing the base resistance. Minority carriers are transported mainly through the lightly doped region.

Wherever the term "carrier diffusion length" is used herein, it refers to minority carrier diffusion length.

While the invention is exemplified in the figures as being an NPN transistor, it will, of course, be understood that it may be a PNP transistor with comparable structure and characteristics.

While it has hereinbefore been stated that it is preferable to have the potential barrier across the L-H junction to be larger than 0.1 eV, it is still better to have the barrier larger than 0.2 eV.

As the term 'L-H junction' is used herein, it means the junction between a lightly doped portion and a heavily doped portion in a region of one impurity type.

It will be apparent to those skilled in the art that many modifications and variations may be effected without departing from the spirit and scope of the novel concepts of the present invention.

We claim as our invention:

1. A semiconductor device comprising:
   a. a semiconductor substrate having a major surface;
   b. a first semiconductor region of one conductivity type;
   c. a second semiconductor region of the opposite conductivity type facing said surface, surrounding said first region forming a first PN junction therewith;
   d. a third semiconductor region of said one conductivity type surrounding said second region forming a second PN junction therewith;
   e. said first region having a first lightly doped portion adjacent to said first PN junction and a first heavily doped portion facing said surface and forming a third junction between said first lightly and first heavily doped portions;
   f. said third junction being located from said first PN junction by a distance whose greatest distance in a perpendicular direction at any point in said first PN junction is less than the diffusion length $L_1$ of minority carriers in said lighly doped portion and having an electric field at said third junction which is larger than $10^3$V/cm.
   g. said third region having a second lightly doped portion adjacent to said second PN junction and a second heavily doped portion facing said surface, surrounding said lightly doped portion and forming a fourth junction between said second lightly and second heavily doped portions;
   h. said fourth junction being located from said second PN junction by a distance whose greatest distance in a perpendicular direction at any point in said second PN junction is less than the diffusion length $L_2$ of minority carriers in said lighly doped portion and having an electric field at said fourth junction which is larger than $10^3$V/cm, and
   i. biasing means for transporting majority carriers in said first region to said third region in a first period and transporting majority carriers in said third region to said first region in a second period.

2. A semiconductor device according to claim 1, in which said second heavily doped portion has a portion extended inwardly along said surface.

3. A semiconductor device according to claim 1 in which the potential barriers at said third and fourth junctions is larger than 0.1 eV.

4. A semiconductor device according to claim 1 in which said electric field at said third and fourth junctions is larger than $kT/(qL)$ where $k$ is the Bolzmann constant, $T$ is the temperature and $q$ is the charge of the minority carrier.

5. A semiconductor device according to claim 1 in which said second region includes a layer portion lying parallel to said major surface and a ring-like portion rising from said layer portion to said major surface, said ring-like portion being highly doped.

6. A semiconductor device according to claim 5 in which said second heavily doped portion of said third region includes a layer portion lying parallel to said major surface and a ring-like portion rising from said second heavily doped portion to said major surface.

7. A semiconductor device according to claim 6 in which said layer portion of said second region extends laterally into contact with said ring-like portion of said second heavily doped portion of said third region.

* * * * *